United States Patent
Bao et al.

(10) Patent No.: US 9,459,333 B2
(45) Date of Patent: Oct. 4, 2016

(54) ALIGNMENT PHANTOM FOR MR/PET SYSTEM

(71) Applicants: Jun Bao, Knoxville, TN (US); David Faul, Knoxville, TN (US); Ralf Ladebeck, Erlangen (DE); John Thomas Pawlak, Villa Park, IL (US); Elmar Rummert, Eralngen (DE); Charles C. Watson, Knoxville, TN (US)

(72) Inventors: Jun Bao, Knoxville, TN (US); David Faul, Knoxville, TN (US); Ralf Ladebeck, Erlangen (DE); John Thomas Pawlak, Villa Park, IL (US); Elmar Rummert, Eralngen (DE); Charles C. Watson, Knoxville, TN (US)

(73) Assignees: Siemens Medical Solutions USA, Inc., Malvern, PA (US); Siemens Aktiengesellschaft, Munich (DE)

( * ) Notice: Subject to any disclaimer, the term of this patent is extended or adjusted under 35 U.S.C. 154(b) by 920 days.

(21) Appl. No.: 13/753,894

(22) Filed: Jan. 30, 2013

(65) Prior Publication Data
US 2013/0141098 A1    Jun. 6, 2013

Related U.S. Application Data

(63) Continuation-in-part of application No. 13/552,962, filed on Jul. 19, 2012, now abandoned.

(60) Provisional application No. 61/509,182, filed on Jul. 19, 2011.

(51) Int. Cl.
| | | |
|---|---|---|
| G01R 33/58 | (2006.01) | |
| G01T 1/16 | (2006.01) | |
| G01R 33/48 | (2006.01) | |

(52) U.S. Cl.
CPC ............ *G01R 33/481* (2013.01); *G01R 33/48* (2013.01); *G01R 33/58* (2013.01); *G01T 1/1603* (2013.01); *G01R 33/4812* (2013.01)

(58) Field of Classification Search
CPC ........................ G01R 33/481; G01T 1/1603
See application file for complete search history.

(56) References Cited

U.S. PATENT DOCUMENTS

| | | | |
|---|---|---|---|
| 4,939,464 A | 7/1990 | Hammer | |
| 7,702,378 B2 * | 4/2010 | Bolan | A61B 19/54 600/414 |
| 7,835,782 B2 | 11/2010 | Cherry et al. | |
| 8,073,525 B2 * | 12/2011 | Ladebeck | G01R 33/481 600/407 |
| 2003/0090267 A1 | 5/2003 | Rubashov | |

(Continued)

FOREIGN PATENT DOCUMENTS

| | | |
|---|---|---|
| DE | 102005015071 | 10/2006 |
| WO | 03003038 | 1/2003 |

OTHER PUBLICATIONS

S. Umeyama, "Least-Squares Estimation of Transformation Parameters Between Two Point Patterns," IEEE Transactions on Pattern Analysis and Machine Intelligence, vol. 13, No. 4, pp. 376-380, Apr. 1991.

(Continued)

*Primary Examiner* — Casey Bryant

(57) ABSTRACT

A phantom for co-registering a magnetic resonance image and a nuclear medical image is disclosed. The phantom includes a longitudinal member having a first end cap and a second end cap and a chamber contained within the longitudinal member. The chamber contains a fluid for producing a first image using a first imaging modality. The phantom further includes a first rod disposed within the chamber of the longitudinal member. The first rod contains a radioactive substance for producing a second image using a second imaging modality.

9 Claims, 7 Drawing Sheets

(56) References Cited

U.S. PATENT DOCUMENTS

| | | | |
|---|---|---|---|
| 2006/0250133 A1 | 11/2006 | Krieg et al. | |
| 2008/0036459 A1* | 2/2008 | Gortler | G01R 33/28 324/307 |
| 2008/0269594 A1* | 10/2008 | Paul | G01R 33/481 600/411 |
| 2010/0198063 A1* | 8/2010 | Huber | A61B 5/05 600/437 |
| 2013/0267829 A1* | 10/2013 | Ojha | A61B 6/032 600/411 |

OTHER PUBLICATIONS

Rodriguez-Ruano, et al., "PET/CT Alignment for Small Animal Scanners based on Capillary Detection", 2008 IEEE Nuclear Science Symposium Conference Record, Nov. 14, 2008, pp. 3832-3835.

ECAT 951; PET Camera CTI-951R-31, Siemens Medical Systems, Inc.; Order No. A91004-M2330-G003-01-4A00.

* cited by examiner

ALIGNMENT PHANTOM FOR MR/PET SYSTEM

PRIORITY CLAIM TO RELATED APPLICATION

This application is a Continuation In Part (CIP) of U.S. Non-Provisional patent application Ser. No. 13/552,962, which claims priority from U.S. Provisional Patent Application Ser. No. 61/509,182, filed Jul. 19, 2011, the disclosure of which is incorporated by reference in its entirety herein.

TECHNICAL FIELD

In general, the invention relates to nuclear medicine. More particularly, the invention relates to phantoms used for quality control measurement and calibration of nuclear medical imaging devices.

BACKGROUND

Magnetic resonance imaging (MRI) is primarily used in medical imaging to visualize anatomical structure of a patient's body. MRI technology can provide detailed images of the body in any plane. MRI has the ability to show soft tissue contrasts, which makes MRI scans especially useful in neurological, musculoskeletal, cardiovascular, and oncological imaging. MRI scans use a powerful magnetic field to align the magnetization of hydrogen atoms in the body. Radio waves are used to systematically alter the alignment of such magnetization, thereby causing the hydrogen atoms to produce a rotating magnetic field detectable by the MRI system. The resulting signal can be manipulated by additional magnetic fields to build up enough information to reconstruct an image of the body.

Positron emission tomography (PET) is a nuclear medicine imaging technique that produces a three-dimensional image or map of functional processes in a patient's body. A PET system detects pairs of gamma rays emitted indirectly by a positron-emitting radioisotope, which is introduced into the body on a non-metabolically or metabolically active molecule. As the radioisotope undergoes positron emission decay (also known as positive beta decay), it emits a positron, the antimatter counterpart of an electron. After travelling up to a few millimeters, the positron encounters and annihilates with an electron, producing a pair of annihilation (gamma) photons moving in opposite directions, which are then detected when they reach a scintillator material in a scanning device of the PET system. Images of metabolic activity and other physiological and biochemical events in space are then reconstructed by computer analysis.

The most significant fraction of electron-positron decays result in two 511 keV gamma photons being emitted at almost 180 degrees to each other. Thus, it is possible to localize the source of the positron annihilation event along a straight line of coincidence (also referred to as a line of response (LOR)), and then an image reconstruction can be performed using coincidence statistics. For example, using statistics collected from a plurality of coincidence events, a set of simultaneous equations for a total activity of each parcel or bit of tissue (also called a voxel) along many LORs can be solved by a number of techniques, and thus a map of radio-activities as a function of location for parcels or bits of tissue can be constructed and plotted. The resulting map shows the tissues in which the molecular probe has become concentrated, and the resulting map can be interpreted by a physician and used for patient diagnosis and treatment. The parcels or bits of tissue can be quite small since the gamma ray event energy is large. This is one of the advantages of PET—a high signal to background ratio.

PET scans are commonly read alongside CT scans, in an attempt to produce a combination image by "co-registration" that gives the physician both anatomic and metabolic information about the patient's body. It is widely accepted that co-registration of anatomical information improves the diagnostic value of functional imaging, as can be seen in the success of hybrid scanners using PET and CT imaging. Recently, hybrid scanners using PET and MRI imaging have become available. The combination of PET and MRI may offer advantages, such as higher soft tissue contrast in the MRI anatomical images, real simultaneous acquisition, and minimum radiation exposure to the patient.

In general, a phantom is used to calibrate and/or verify the accuracy of nuclear medical imaging devices such as PET scanners or MR scanners. In essence, a phantom contains positron emitting activity in a known shape and uniform distribution of radiation activity throughout the body. Thus, by imaging the phantom with its known geometry and radiation distribution, the accuracy of the software used to assemble the various tomographic slices acquired by the imaging apparatus into three-dimensional representations of a patient's region of interest can be assessed and, if necessary, the various apparatus settings can be adjusted.

More specifically, the purpose of the alignment phantom is to measure the orientation and offset of the PET field of view with respect to the MR field of view.

Recently, a fully integrated magnetic resonance/PET scanner has been developed, which integrated scanner allows for simultaneous MR and PET imaging (see, e.g., U.S. Pat. No. 8,073,525, to Ralf Ladebeck et al. and incorporated herein by reference). Such a scanner requires a dedicated phantom which, in addition to facilitating quality control assessment of the PET scanning functionality of the machine, facilitates a determination of the extent to which operating the MR functionality of the machine influences the PET signals acquired by the machine.

A conventional phantom will not work for this purpose because the MR coil of the scanner has to experience a certain load in order to dampen the resonance peak sufficiently, even when maximum RF power is applied to the coil. Otherwise, if the MR coil is not loaded when maximum RF power is applied, too much current will be developed in the MR resonance circuit, and that current could potentially be large enough to destroy the MR coil itself.

Thus a need exists for a hybrid phantom that can accommodate a PET scanner, a MR scanner and/or a MR/PET scanner and overcome the problems in the prior art.

SUMMARY

Embodiments of the invention provide a phantom for co-registering a magnetic resonance image and a nuclear medical image is disclosed. The phantom includes a longitudinal member having a first end cap and a second end cap and a chamber contained within the longitudinal member. The chamber contains a fluid for producing a first image using a first imaging modality. The phantom further includes a first rod disposed within the chamber of the longitudinal member. The first rod contains a radioactive substance for producing a second image using a second imaging modality.

In a first aspect, an embodiment of the invention provides a method of aligning a Positron Emission Tomography (PET) Field of View (FoV) with a Magnetic Resonance Imaging (MR) FoV, the method includes providing a phantom, imaging the phantom with MR to provide an MR image, imaging the phantom with PET to provide a PET image, and applying voids detected in the MR image to align the PET FoV with the MR FoV.

In another aspect, the invention features a method of quality control testing an integrated multimodality medical imaging scanner, wherein magnetic resonance constitutes one of the modalities. The method includes disposing a phantom within the scanner, the phantom comprising a plastic housing having a plurality of rods containing a radioactive substance along an axis of the plurality of rods to provide an image using a second imaging modality. The method further includes operating magnetic resonance imaging features of the scanner, and simultaneously imaging the phantom using the second modality imaging feature of the scanner because the phantom allows both modalities to be imaged. The modalities can be imaged sequentially or simultaneously.

BRIEF DESCRIPTION OF THE DRAWINGS:

Exemplary embodiments of the invention will now be described in greater detail with reference to the attached drawings, in which.

DETAILED DESCRIPTION

A method and apparatus for providing image alignment for combined positron emission tomography (PET) and magnetic resonance imaging (MRI) are described. In the following description, for the purposes of explanation, numerous specific details are set forth in order to provide a thorough understanding of the embodiments of the invention. It is apparent, however, to one skilled in the art that the embodiments of the invention may be practiced without these specific details or with an equivalent arrangement. In other instances, well-known structures and devices are shown in block diagram form in order to avoid unnecessarily obscuring the embodiments of the invention.

Co-registration of anatomical information can greatly improve the diagnostic value of functional imaging. For example, the combination of PET and MRI images can offer numerous advantages, such as higher soft tissue contrast in the MRI anatomical images, real simultaneous acquisition, and minimum radiation exposure to the patient. Correlative imaging can open exciting new applications in oncology, neurology, and cardiology. Combining functional information from nuclear medical imaging with anatomical information from CT or MRI images has become of great interest since PET tracers are becoming more and more organ and tissue specific. MRI images have the additional advantage of providing physiological information. Image co-registration and fusion techniques are being developed and optimized for the interpretation of PET, CT, and MRI data. While medical imaging apparatuses that combine PET and CT systems in one hardware device have been used in oncology, the combination of PET with MRI exhibits several technical challenges.

Figure 1:
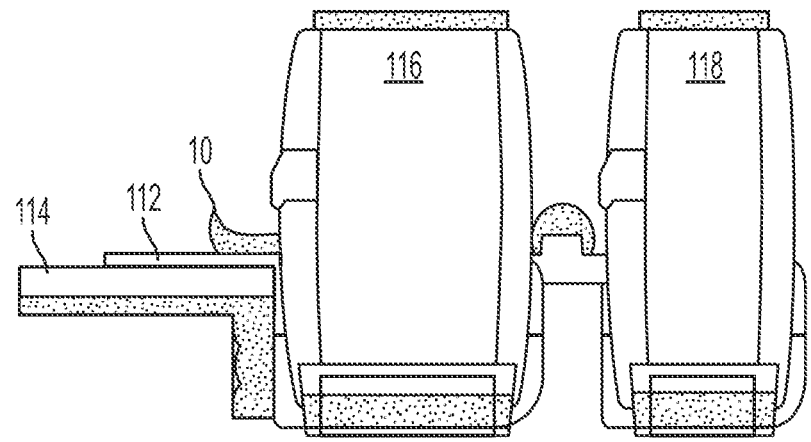
FIG. 1 is a combined positron emission tomography (PET) and magnetic resonance imaging (MRI) scanning system in which the PET scanner and the MRI scanner are axially offset and aligned.

FIG. 1 depicts one possible PET-MRI scanner system. In the PET-MRI scanner system shown in FIG. 1, a patient 10 is positioned on a pallet 112 that is movably supported by a table 114. The pallet 112 is axially movable on the table 114 in a left-right direction as shown in FIG. 1. The PET-MRI scanner system in FIG. 1 includes an MRI scanner 116 and a PET scanner 118 that are axially aligned along the moving direction of the pallet. Thus, the patient 10 can be moved through a patient scanning space in the MRI scanner 116 and through a patient scanning space in the PET scanner 118 to perform sequential imaging in each scanner. However, such sequential imaging can prove to be troublesome, since generating a combination image by co-registration of the PET image and the MRI image can be very difficult and inaccurate. For example, when PET and MRI datasets are acquired separately, as in such a sequential imaging arrangement, alignment inaccuracies can frequently occur between the PET image and the MRI image due, for example, to movement or repositioning of the patient during scanning or while transporting the patient from one modality to the next.

Figure 2:
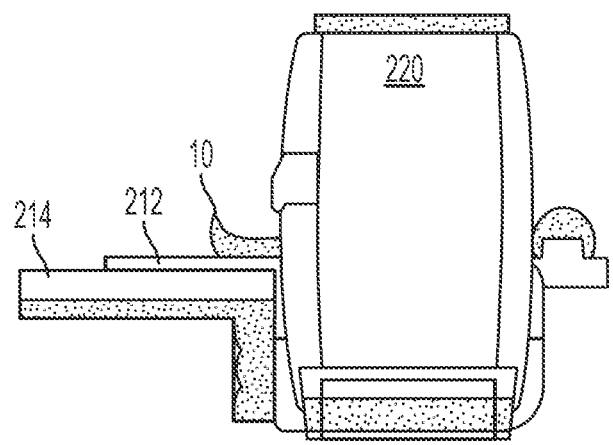
FIG. 2 is a combined PET and MRI scanning system in which the PET scanner and the MRI scanner are provided in a single unit for simultaneous PET and MRI scanning, according to an exemplary embodiment.

In order to reduce such alignment inaccuracies, another possible PET-MRI scanner system can be provided that performs simultaneous PET and MRI scans. FIG. 2 depicts an embodiment of such a combined PET-MRI scanner system with simultaneous measurements. In the embodiment of FIG. 2, the patient 10 is positioned on a pallet 212 that is movably supported by a table 214. The pallet 212 is axially movable on the table 214 in a left-right direction as shown in FIG. 2. The PET-MRI scanner system in FIG. 2 includes a combined PET and MRI scanner 220 that houses both an MRI scanner and a PET scanner that can simultaneously scan the patient 10 as the patient 10 is axially moved through a patient scanning space in the combined PET and MRI scanner 220. As the PET imaging and the MRI imaging are performed simultaneously along the patient's body, the alignment inaccuracies noted above can be reduced or eliminated.

In principle, a combined PET and MRI scanner will provide simultaneous functional and anatomical information with near perfect spatial registration. By fully integrating a PET scanner inside a magnet of an MRI scanner, true simultaneous imaging can be realized. However, both PET and MRI images are based on different coordinate systems (image domains). The PET image domain (x, y, z) coordinate system is fixed in "absolute" space and it is relative to the PET gantry within the scanner. Thus, the positioning of the PET coordinate system is known through engineering design. On the other hand, the MRI image domain ($x_m$, $y_m$, $z_m$) coordinate system is not absolute in space and will change based on several MRI specific tuning and shimming procedures, thereby making the alignment of both modalities difficult. Accordingly, a special alignment procedure is needed in order to achieve a valid image fusion (co-registration) of both a PET imaging modality and an MRI modality.

That is, in order for a clinical medical imaging system to acquire simultaneous MR/PET acquisitions in which the information in the two images can be correlated, the MR/PET system preferably measures the offset, orientation, and scale of the PET image coordinate system with respect to that of the MR system so that the images can be scaled, rotated and translated into alignment. The offset, rotation, and scale of the PET and MR coordinate systems can be measured with an alignment phantom that can be imaged by both the MR and PET subsystems as with the current invention.

The PET and MR image acquisitions need not be simultaneous if the position of the phantom remains unchanged between the PET and MR acquisitions and if a sufficient number of features in the two views of the phantom can be correlated.

Figure 3A:
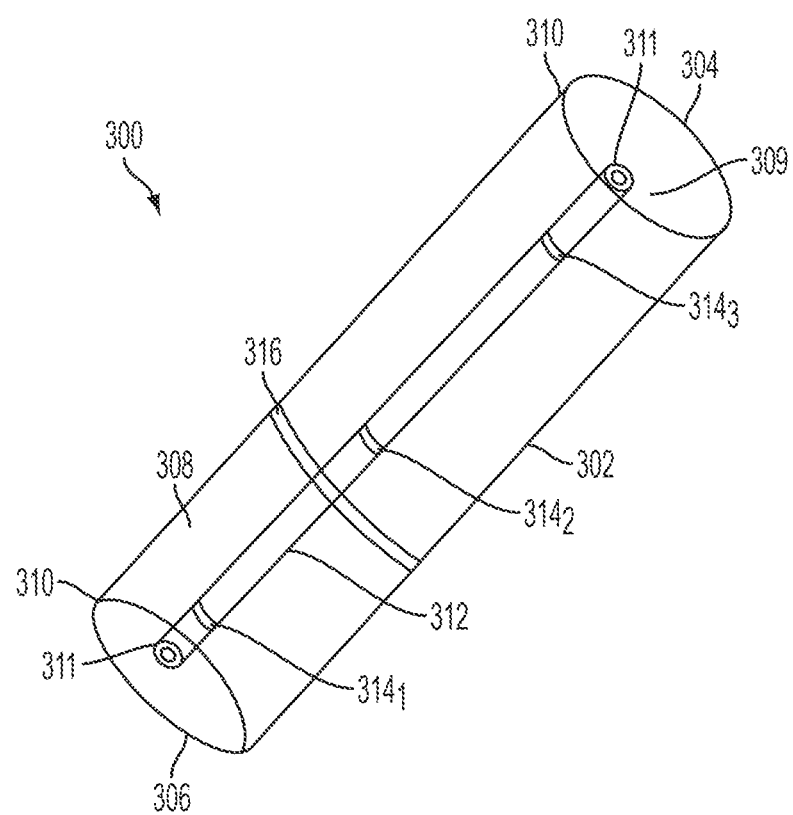
FIG. 3A is a schematic perspective view of a PET-MRI phantom for use in a process for providing image alignment for combined PET and MRI scanning, according to an exemplary embodiment.
Figure 3B:
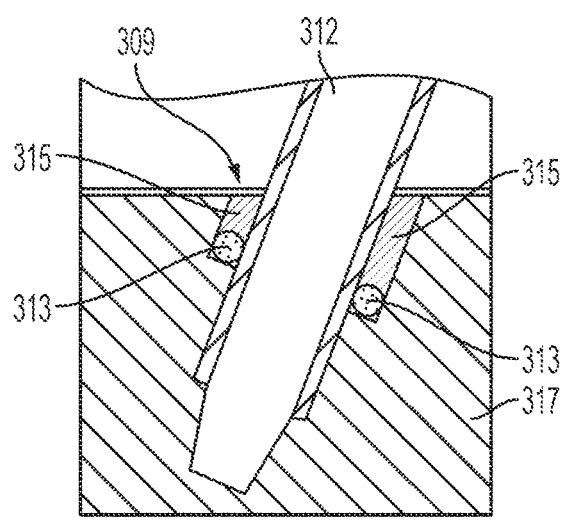
FIG. 3B is an exploded view of a rod in an opening of an end cap in accordance with an exemplary embodiment of the invention.
Figure 4:
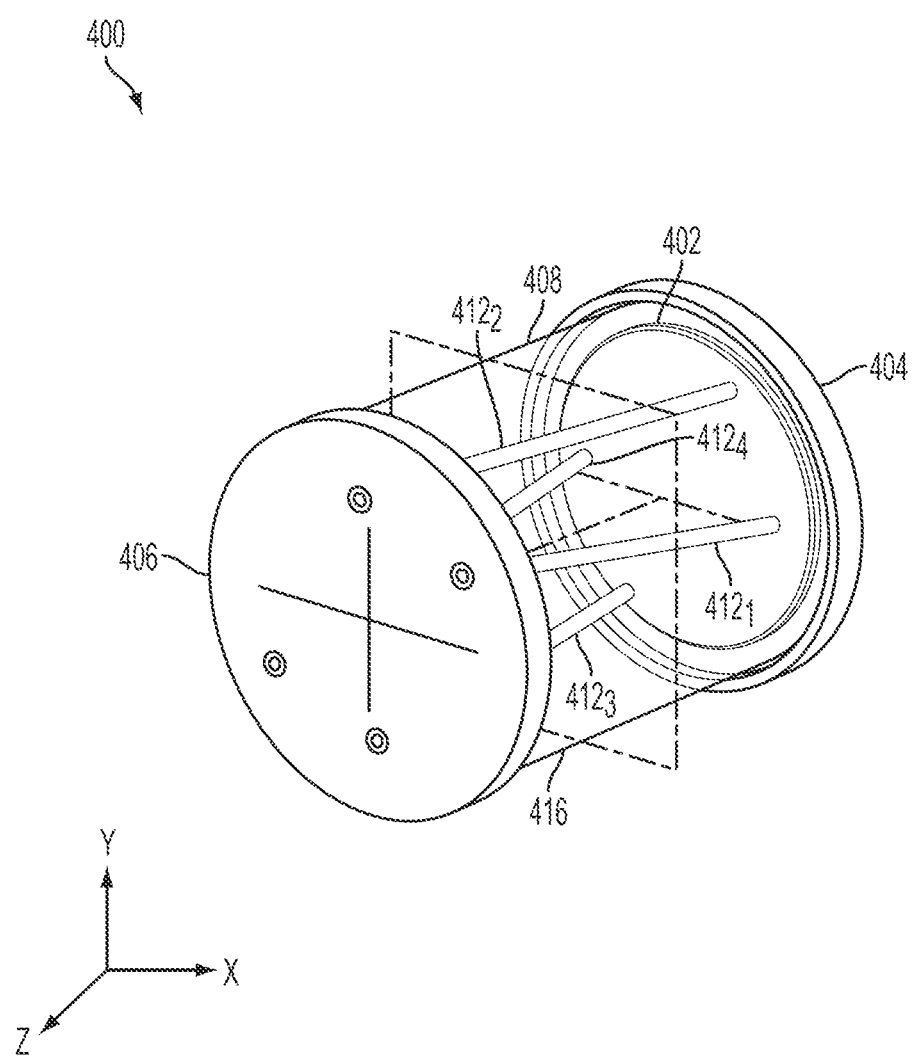
FIG. 4 is a view of a PET-MRI phantom depicting a plurality of rods for use in a process for providing image alignment for combined PET and MRI scanning, according to an exemplary embodiment.

FIGS. 3 and 4 depict embodiments of PET-MRI phantoms that can be used with an alignment procedure to align PET and MRI modalities in order to provide image registration, according to embodiments of the present invention. Such PET-MRI phantoms can be used with a fully automated alignment algorithm to provide an advantageous alignment procedure. Embodiments of the PET-MRI phantom meet requirements regarding visibility for both the PET scanning system and the MRI scanning system, in order to provide a dual-system phantom.

The design of the alignment phantom 300 enables a coordinate system to be determined in the MR system with respect to a location known in the MR Field of View (FoV), and determines the position of that same coordinate system in the PET FoV. The offset rotations, and scaling are computed from this information in order to fuse the PET and MR FoVs in the MR image display system. This fusion facilitates the correlation of the information in each type of image.

The phantom 300 comprises a first longitudinal member 302 that is cylindrical in shape and defines a chamber 308. Longitudinal member 302 comprises a first end cap 304 and a second end cap 306. The combination of longitudinal member 302, first end cap 304 and second end cap 306 comprise a casing 310. The casing 310 is preferably cylindrical, and transparent. First end cap 304 and second end cap 306 are attached to longitudinal member 302 via at least one of a pressure mount arrangement, screw on arrangement, adhesive, and the like. Preferably, at least one of the first end cap 304 or the second end cap 306 is attached to the longitudinal member 302 such that the end caps 304 and 306 can be reattached and removed at the convenience of a user. The longitudinal member 302, first end cap 304 and second end cap 306 comprise, preferably, a plastic material. For example, The preferred material for the longitudinal member 302 is acrylic plastic, and the preferred material for the end caps 304 and 306 of the phantom 300 is ABS plastic. However, it should be appreciated by those skilled in the art that the end caps 304 and 306 and the longitudinal member may be constructed of any material that is compatible with the operating environment of a MR clinical imaging system.

In addition, the construction material in the embodiment must not exhibit multiple MR images due to chemical shifts.

At least one of first end cap 304 or second end cap 306 includes a sealable opening 309 for filling the chamber 308 with a liquid or magnetic resonance material upon which the MRI scan acts to generate an MRI image. In an embodiment of the present invention, no sealable opening is required, a user simply removes either first end cap 304 or second end cap 306, fills the chamber 308 with the liquid and reseals first end cap 304 or second end cap 306 to the longitudinal member 302.

In an embodiment of the present invention, the phantom 300 is structured and arranged to enable the rods 312 to be held in place by gravity. In another embodiment the rods are held in place via clips or similar type retention mechanism above an orifice in the end caps 304 and 306 through which the rods are inserted. Preferably the ends of the rods 312 are tapered as well as the opening 309 in the end caps see FIG. 3B. A groove 315 is placed in the opening 309 in the end caps. The O-rings 313 rest within the groove 309. Once the O-ring 313 is in place, the assembly is epoxied via an epoxy 317 to provide a second seal.

The O-ring 313 ensures that the line source outer diameter and the rod outer diameter 311 are collinear at least on one end. The O-ring 313 allows the absolute diameter of the rod to vary while still keeping the line sources centered. The ends of the rods 312 can be left closed or kept open. For example a seal or screw at the ends of the rods 312 can be used to keep out fluids.

The chamber 308 can be filled with water having a dissolved salt such as $NiSO_4$, MnCl, NACL, and the like, in order to reduce the MR imaging time. The water and salt therein represent a certain load for MRI transmit and receive coils of the MRI scanning device, and such that hydrogen inside the water compound delivers an MRI signal at a certain resonance frequency, which can be detected by the MR receive coil. In an embodiment of the invention, the chamber 308 is filled with an oil such as mineral oil. It should be appreciated by those skilled in the art that other types of oils can also be used without departing from the scope of the present invention. It should also be appreciated that a low viscosity substance such as a gel can also be used.

In another embodiment of the present invention, the chamber 308 is filled with silicone containing hydrogen as the fluid material. The content of silicone containing hydrogen provides the MRI scanning system with enough mass of hydrogen to allow for frequency and transmitter adjustment. During scanning, the chamber 308 containing the fluid material is generally only visible in the MRI scan and not in the PET scan.

The longitudinal member 302 includes a second longitudinal member 312 also known as a rod. The rod 312 is hollow in its center for the placement of PET line sources along the axis of the rod 312 and because the hollow rod 312 produces a void in the MR signal which allows the MR FoV to be measured and positioned. The rod 312 preferably has markings on its surface to indicate end points $314_1$ and $314_3$ and a center point $314_2$ of the PET line sources within the rod 312. The rod 312 containing the line sources is preferably ABS plastic, aluminum or another type of metallic material.

The rod 312 is mounted in a fluid such as salt doped water, water with a dissolved salt, or a mineral oil filled casing 310. The PET scanner detects the radiation from the annihilation of the positrons emitted from the line sources, and the MR detects the signal void caused by the rods in the fluid. The alignment procedure requires performing image processing on the images in order to determine the centroids of the voids in each MR image and of the line sources in each PET image, fitting lines to the sets of MR and PET centroids, and computing the offset, rotation and scale of the PET coordinate system with respect to the MR coordinate system.

In an embodiment of the invention, the axis of an outside diameter 311 of the rod 312 is required to be collinear with the axis of the line source.

In an embodiment of the invention the phantom 300 includes a central mark 316 on its surface that can be aligned to the Field of View (FoV) center defined by the MR positioning lasers. MR imaging is used to visualize with MR the liquid filling the cylindrical chamber 308 outside the rods 312.

In principle at least two rods determine a coordinate system. Two rods provide three vectors along each rod and along the shortest path between the rods allowing a 3D rotational correction to be made. The order and magnitude of translations and rotations provide a solution to bridge the coordinate system between PET and MR. The calculations can be determined via rod pairs or amongst individual rods. It should be appreciated by those skilled in the art that other combinations can be realized without departing from the scope of the invention.

FIG. 3A depicts a single rod 312 for ease of viewing. However, a plurality of rods can be used with the invention. When more rods are used, then the coordinate system can be determined from the line segment along the shortest path between rod pairs. The measured length of these line segments in the MR images gives a quality measurement of MR scaling errors that could be the result of non-linear gradient fields. As the number of rods used increases, the accuracy of the FoV offset correction and scaling is improved.

In addition, with two rods the MR and PET coordinate systems can be scaled. The orthogonal distance between the rods can be used for checking the scaling in X, Y, Z directions with the proper rod placement.

As shown in FIG. 4 four rods $412_1$, $412_2$, $412_3$ and $412_4$ pass from a first end cap 404 to a second end cap 406 with each of the rods 412 preferably tilted or skewed with respect to the axis of a longitudinal member 402 in planes perpendicular to the Y axis (top and bottom) and X axis (right and left). The tilt angle can be as little as 0.5 degrees.

Each of the rods 412 has a hole drilled through its axis. In this embodiment of the invention, the holes hold four line sources with activity that emits positrons for imaging with PET. The cladding of the line sources is a non-magnetic, non-porous material. In one embodiment of the invention, the line source activity is clad in a sheath of aluminum.

The phantom 400 includes a central mark on its surface that can be aligned to the FoV center defined by the MR positioning lasers. Specifically, the central mark is used to position the alignment phantom near the MR and PET FoV centers so that the measurement need not be repeated after re-positioning the phantom. MR imaging is used to visualize the liquid filling the cylindrical chamber 408 outside the rods 412.

In a preferred embodiment of the invention, the diameter and the length of the phantom 400 allows for the phantom 400 to be in the FoV of the PET FoV and the MR FoV. An exemplary diameter for the phantom 400 is no greater than about 20 cm in order to sample the MR FoV where it has the least distortion due to gradient non-linearities. The rod length projected on the phantom axis should be about 30 cm in order to cover the PET FoV. However, it should be appreciated by those skilled in the art, that these ranges can vary based on the manufacturer and model of imaging machine used. For example, the dimensions are dependent on the MR magnet design. Another size magnet could allow a larger phantom or require a smaller one.

In an embodiment of the present invention, the phantom 400 is structured and arranged to enable the rods to be held in place by gravity. In another embodiment the rods are held in place via clips or similar type retention mechanism above an orifice in the end caps 404 and 406 through which the rods are inserted. In still another embodiment of the invention, the rods are held in place via O-rings residing in a groove in at least one end cap 404 or end cap 406. Preferably, the O-rings reside in both end caps 404 and 406. The O-ring ensures that the line source outer diameter and the rod outer diameter are collinear at least on one end. The O-ring allows the absolute diameter of the rod to vary while still keeping the line sources centered. The ends of the rods 412 can be left closed or kept open. For example a seal or screw at the ends of the rods 412 can be used to keep out fluids.

Figure 5:
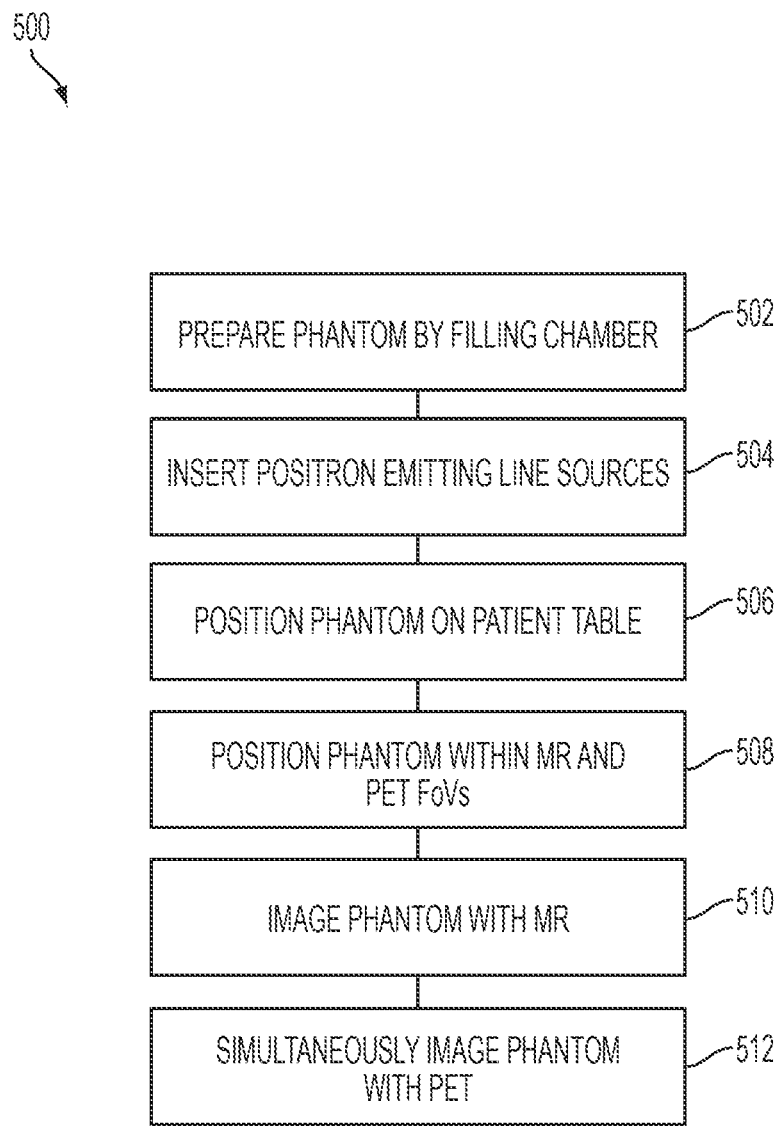
FIG. 5 is a flow chart setting forth a process for providing data acquisition using the phantom for alignment for combined PET and MRI scanning, according to an exemplary embodiment.

FIG. 5 is a flow chart setting forth a process 500 for providing data acquisition using the phantom for alignment for combined PET and MRI scanning, according to an exemplary embodiment. The process is initiated at step 502 where the phantom is prepared for the MR/PET alignment procedure by ensuring that the cavity surrounding the rods is filled completely with a fluid such as a salt dissolved in water or mineral oil and the like that can be imaged in an MRI.

At step 504, the four positron emitting line shaped sources of activity that are visible with the aid of PET will be inserted into the holes bored through the rods of the phantom 300.

At step 506, the alignment phantom is positioned on the MR/PET patient table. The phantom is positioned with means such as mechanical, electrical or combination thereof, that ensure that the orientation and position of the alignment phantom with respect to the MR system is known.

At step 508, the MR/PET patient table transports the alignment phantom to within approximately 1 cm of the centers of the overlapping MR FoV and PET FoV.

At step 510, the phantom 300 is imaged with the MR system, and the MR images are reconstructed. The rods are visible in the MR images as oval areas where the MR signal is absent from the images.

At step 512, simultaneously with the MR image acquisition, the phantom is imaged with the PET system. In an embodiment, the PET images are reconstructed without attenuation and scatter correction since information to align the attenuation map with the phantom is not known at this step. The PET positron line sources are visible as four, round, bright points in a dark background.

In another embodiment, the rods are non-metallic with a negligible chemical shift and the MR and PET data are acquired simultaneously.

Figure 6:
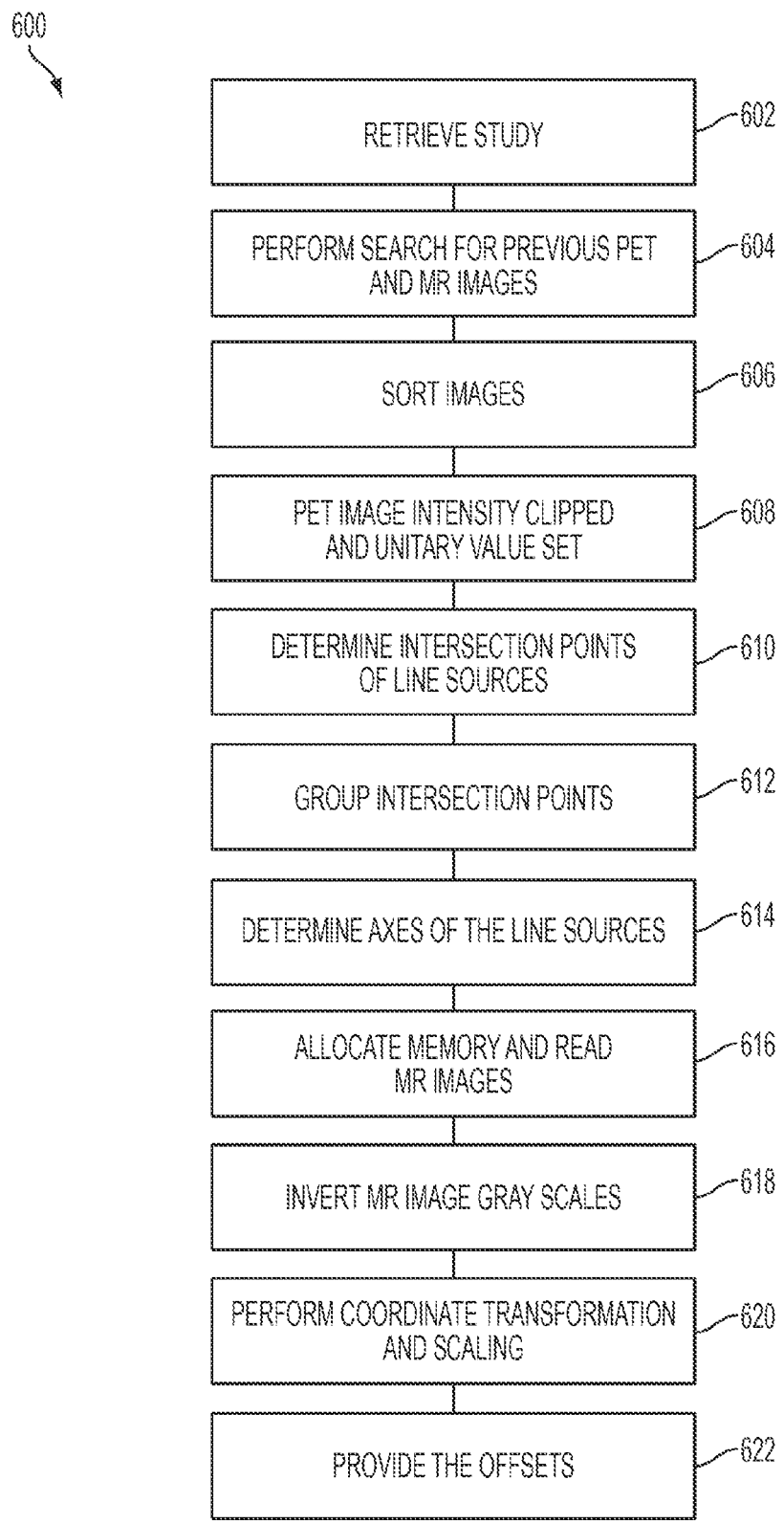
FIG. 6 is a flow chart setting forth a process for providing data processing using the phantom for alignment for combined PET and MRI scanning, according to an exemplary embodiment.

FIG. 6 is a flow chart setting forth a process 600 for providing data processing using the phantom for alignment for combined PET and MRI scanning, according to an exemplary embodiment. At step 602 a study is retrieved. At step 604 a search is performed for the previously acquired PET images and MR images. A failure message is returned if one or more of the image data is missing. The process 600 proceeds to step 606.

At step 606, the MR and PET images are sorted in descending order. Memory is allocated and the PET images are read from the data files.

At step 608, the PET image intensity is clipped significantly above the noise and set to a unitary value on a plane by plane basis in order to eliminate the bias introduced by the absent attenuation and scatter corrections.

At step 610, A determination is made as to the intersection points of the line sources with the PET image planes by searching for the binary PET bright spots and computing the centroid of each bright spot.

At step 612, Intersection points are grouped into sets or pairs with one set per line source.

At step 614, the axes of the line sources are determined by fitting lines to the sets of line source centroids computed in each plane.

At step 616, memory is allocated and the MR images are read from the data files.

At step 618, the MR image gray scale is inverted so that the dark pixels become dark. Steps 608 through 612 are repeated for the rods visible as signal voids in the MR images.

At step 620, the coordinate transformation e.g., offset, rotations, and scaling are calculated as described below in equations 1 and 2 below. The phantom 400 with four rods has four line sources having six independent line pairs and six pairs of independent calibration points where each calibration point pair is defined by end points of the shortest line segment between each line pair.

At step 622, the calculated offsets are provided to the client.

In another embodiment of the invention, the process 600 could be iterated at least twice with the attenuation and scatter corrections applied to the PET data in the second and subsequent passes in order to determine the offset.

With reference to the alignment process. Equation 1 describes the computation of the rotation matrix R and the translation vector t required to align the MR and PET FoVs. If the singular value decomposition of the covariance matrix between the MR and PET calibration point sets has the form $U\sigma V^T$, where U, Σ and V are matrices and where $V^T$ is the transpose of matrix V, then R and t can be computed from the expressions:

$$R = UV^T \quad \text{(equation 1)}$$

$$T = \mu_{MR} - R\mu_{PET} \quad \text{(equation 2)}$$

Where $\mu_{PET}$ and $\mu_{MR}$ are the centroids of the MR and PET calibration points.

The phantoms 300 and 400 provide the following advantages—the MR signal from the alignment object does not have shadows due to chemical shifts, provides very accurate alignments, provides sufficient information for alignment when imaging a partial volume of the phantom, employs components that can be used for other calibration measurements, provides an activity source that is easy to manufacture and store and can be used for other system calibrations, and all MR adjustments can be easily performed.

Given the above, a phantom as per embodiments of the invention can be used to verify the accuracy of an integrated MR/PET scanner by placing the phantom within the scanner, running the MR features of the scanner at full RF power, and conducting a PET scan of the phantom at the same time. The PET signals/images would then be analyzed to verify their accuracy. Thus, a phantom as per embodiments of the invention eliminates the need for a separate water-based (NaCl solution) phantom doped with FDG, and the hazards associated with such prior art phantoms can be eliminated.

Figure 7:
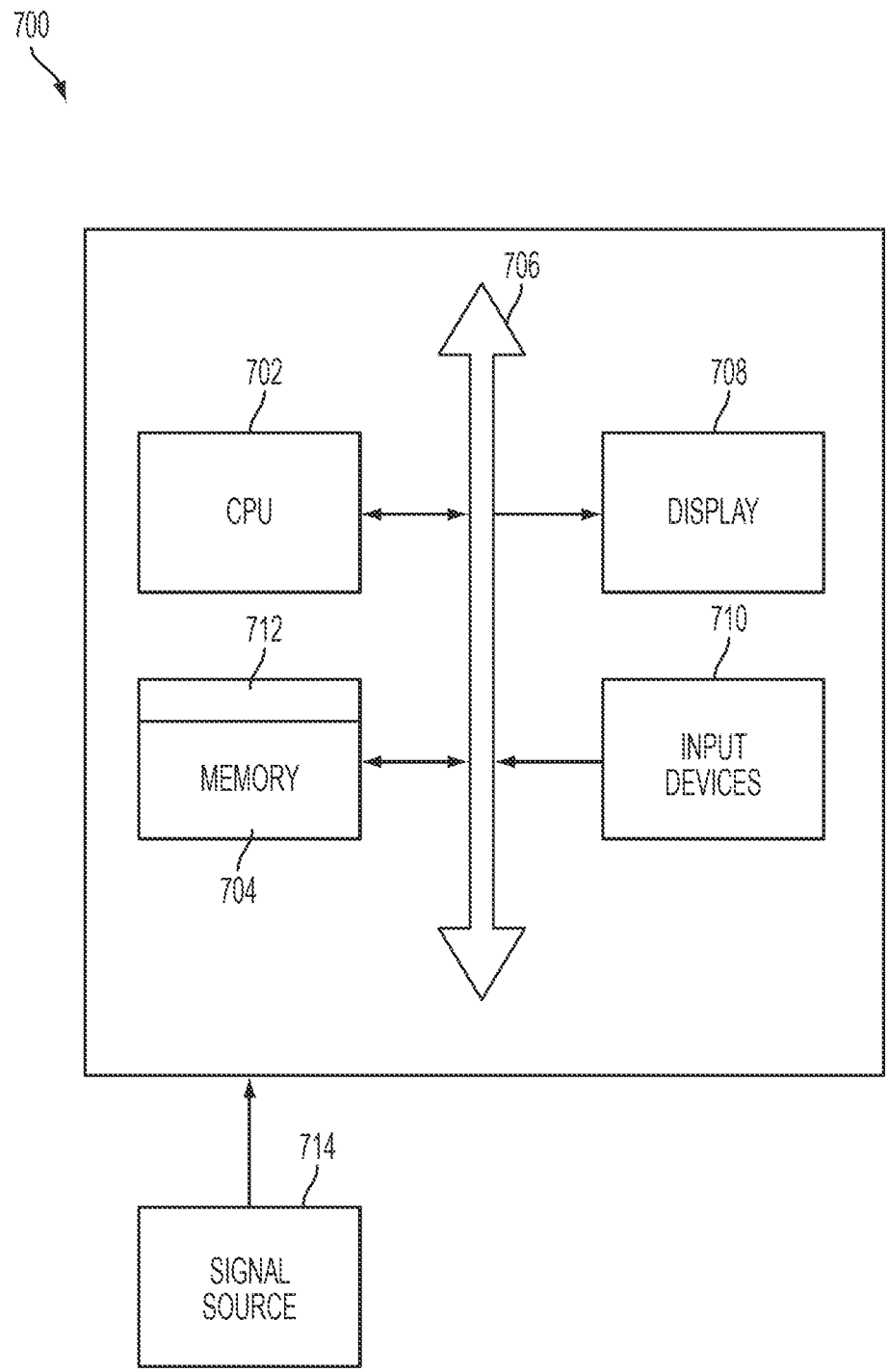
FIG. 7 is a block diagram of an exemplary computer system for implementing an alignment algorithm for a MR/PET imaging system using a single phantom in accordance with an embodiment of the present invention.

Referring now to FIG. 7, according to an embodiment of the present invention, a computer system 700 for implementing the present invention can comprise, inter alia, a central processing unit (CPU) 702, a memory 704 and an input/output (I/O) interface 706. The computer system 700 is generally coupled through the I/O interface 706 to a display 708 and various input devices 710 such as a gamma camera, detector, mouse and a keyboard. The support circuits can include circuits such as cache, power supplies, clock circuits, and a communication bus. The memory 704 can include random access memory (RAM), read only memory (ROM), disk drive, tape drive, hard drive, USB drive, CD, DVD, etc., or combinations thereof. Methods for using invention can be implemented as a routine 712 that is stored in memory 704 and executed by the CPU 702 to process the signal from the signal source 714. As such, the computer system 700 can be a general purpose computer system that becomes a specific purpose computer system when executing the routine 712 of the present invention or a PET/MR, PET or MR system, or combinations thereof.

The computer system 700 also includes an operating system and micro instruction code. The various processes and functions described herein can either be part of the micro instruction code or part of the application program (or combination thereof) which is executed via the operating system. In addition, various other peripheral devices can be connected to the computer platform such as an additional data storage device and a printing device.

It is to be further understood that, because some of the constituent system components and method steps depicted in the accompanying figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

While the invention has been disclosed with reference to specific exemplary embodiments, modifications to and departures from the disclosed embodiments will occur to those having skill in the art. For example, while the invention has been described with reference to an integrated MR/PET system, the phantoms 300 and 400 also could be applicable to other integrated multimodality systems such as MR/SPECT and MR/CT. For example, the CT requires high-density (but not metal rods) rather than line sources and where the CT detects the metal rods in transmission images rather than in emission images. Accordingly, what is protected is defined by the scope of the following claims.

What is claimed is:

1. A phantom for co-registering a magnetic resonance image and a nuclear medical image, said phantom comprising: a longitudinal member having a first end cap and a second end cap and a chamber contained within the longitudinal member, wherein the chamber contains a fluid for producing a first image using a first imaging modality; and a first rod disposed within the chamber of the longitudinal member, wherein the first rod contains a radioactive substance for producing a second image using a second imaging modality, wherein the first imaging modality is magnetic resonance (MR).

2. The phantom of claim 1, wherein the second imaging modality is Positron Emission Tomography (PET).

3. The phantom of claim 1, wherein the second imaging modality comprises Computed Tomography (CT) or Single Photon Emission Computed Tomography (SPECT).

4. The phantom of claim 1, wherein the first rod comprises a non-porous metallic material.

5. The phantom of claim 1, wherein the fluid comprises an oil, a gel, a foam or a salt dissolved in water.

6. The phantom of claim 1, wherein the longitudinal member, the first end cap and the second end cap are comprised of plastic material.

7. The phantom of claim 1, wherein the radioactive substance comprises a line source.

8. The phantom of claim 1, further comprising: a second rod disposed within the chamber of the longitudinal member, wherein the second rod contains a radioactive substance.

9. The phantom of claim 8, wherein the first rod and the second rod are skewed with reference to each other.

\* \* \* \* \*